United States Patent [19]

Miyagawa et al.

[11] Patent Number: 6,114,092
[45] Date of Patent: Sep. 5, 2000

[54] PHOTOSENSITIVE RESIN COMPOSITIONS FOR PHOTORESIST

[75] Inventors: Kenji Miyagawa, Hiratsuka; Kenji Seko, Yokosuka, both of Japan

[73] Assignee: Kansai Paint Co., Ltd., Hyogo-ken, Japan

[21] Appl. No.: 09/161,717

[22] Filed: Sep. 29, 1998

[30] Foreign Application Priority Data

Sep. 29, 1997 [JP] Japan ..................................... 9-262572

[51] Int. Cl.⁷ ............................. G03F 7/031; G03F 7/038
[52] U.S. Cl. ..................................... 430/285.1; 430/287.1; 430/926; 430/920; 430/922; 430/919; 430/947; 522/13; 522/16; 522/24; 522/26; 522/29; 522/103
[58] Field of Search ............................... 430/280.1, 285.1, 430/287.1, 926, 920, 922, 919, 947; 522/13, 16, 24, 26, 29, 103

[56] References Cited

U.S. PATENT DOCUMENTS

| 4,857,654 | 8/1989 | Riediker et al. | 430/281.1 |
|---|---|---|---|
| 5,045,434 | 9/1991 | Yoshihara et al. | 430/286.1 |
| 5,539,064 | 7/1996 | Hashimoto et al. | 525/529 |
| 5,738,974 | 4/1998 | Nagasaka et al. | 430/278.1 |

FOREIGN PATENT DOCUMENTS

| 0 255 486 | 2/1988 | European Pat. Off. . |
|---|---|---|
| 0 733 683 A1 | 9/1996 | European Pat. Off. . |
| 60-221403 | 11/1985 | Japan . |
| 61-233736 | 10/1986 | Japan . |
| 62-31848 | 2/1987 | Japan . |

OTHER PUBLICATIONS

L. Roos, *Printed Circuit World Convention IV,* " Argon Laser–Imageable, Dry Film Photoresist" (Jun. 1987).

K. Ozeki et al., *Gists of the 1st Academic Lecture Meeting of Printed Circuit Society*, pp. 91–92.

Kansai Paint, 1998–366843, English Abstract of JP 10142790A, published May 29, 1998, Derwent Information LTD obtained on West 1.1 A database, 2 pages.

Kansai Paint, 129: 128994, English Abstract of JP 10142790A, published May 29, 1998, Chemical Abstracts Online, ACS obtained on STN database, 2 pages.

*Primary Examiner*—Cynthia Hamilton
*Attorney, Agent, or Firm*—Wenderoth, Lind & Ponack, L.L.P.

[57] ABSTRACT

A photosensitive resin composition for photoresist which is highly sensitive and can directly form an image using a laser is disclosed. Said composition comprises (A) an unsaturated resin having carboxyl group(s) which is obtained by firstly reacting 0.8 to 1.3 moles of an ethylenic unsaturated monocarboxylic acid with 1 mole of an epoxy group of a homopolymer or copolymer of ethylenic unsaturated monomer having an epoxy group to obtain an unsaturated resin which is then reacted with a dibasic acid anhydride, (B) ethylenic unsaturated compound without epoxy group, and (C) photopolymerization initiator.

9 Claims, No Drawings

PHOTOSENSITIVE RESIN COMPOSITIONS FOR PHOTORESIST

BACKGROUND OF THE INVENTION

1. Field of the Invention

The present invention relates to photosensitive resin compositions which may be used for photoresist, and more specifically relates to photosensitive resin compositions which may be used for photoresist of laser direct image formation type photoresist to produce an electroconductive circuit or an electrode pattern substrate formed by a metal such as copper etc. or an electroconductive metal oxide, such as ITO etc.

2. Description of the Prior Art

Photosensitive compositions are widely used for various uses, for example, for photoresist, plate materials for lithography or letterpress, presensitized plates (PS plates) for offset printing, information recording materials, materials for making relief image, and the like.

There are problems that although many of these photosensitive compositions are photosensitive to ultraviolet rays, the photographic sensitivity thereof is generally several tens to several hundreds $mJ/cm^2$ and thus light sources of high output are required and moreover, the efficiency of energy conversion to the imaging is poor. On the other hand, there is an image-forming method wherein an image is directly formed using a light of high energy density such as laser. This method has not only an advantage that energy conversion efficiency becomes better but an advantage that image-forming steps can greatly be simplified. As for light sources for scanning exposure in direct image formation, it is advantageous to use visible light laser, which gives emission of radiation stable in lifetime and intensity, rather than ultraviolet laser. Thus, there has been desired the emergence of visible light sensitive composition having a sensitivity such that scanning exposure by visible light laser is possible, and many visible light sensitive compositions having a high sensitivity to $Ar^+$ laser, which has a stable emission of radiation in a visible region of wavelength 488 nm, have been proposed (please refer, for example, to Japanese Laid-Open Patent Publications Nos. 31848/1987, 233736/1986 and 221403/1985, European Patent 255486, Printed Circuit World Convention IV (1987, June), technical paper 22-2-22-13 Gists of the 1st Academic Lecture Meeting of the Printed Circuit Society, pages 91–92 etc.).

These visible light sensitive compositions are used in dry film form and liquid form. However, they have disadvantages mentioned as follows.

Dry film resist consists usually of a light transmissive support film, a sticky photosensitive resin layer formed thereon, and its protecting film. A pattern forming process using a dry film resist consists of firstly peeling off the protecting film from the dry film, sticking the photosensitive resin layer onto a substrate by pressing, irradiating visible light laser to record an image pattern based on CAD data through the light transmissive support film, then conducting a developing treatment with a developer, which dissolves selectively non-exposed portions to form a desired pattern on the substrate.

Moreover, in case the image-formed substrate is an etchable material such as copper laminated plate etc., an etched pattern may be formed by treating the substrate by etchant. Nowadays, however, electronic circuits became more highly dense, requiring higher resolution of less than 150 μm line width for circuit pattern formation, and a dry film resist cannot meet the requirements any more, because a dry film resist is exposed to a light through a light transmissive support film, which should be as thin as possible to obtain a high resolution but need to be somewhat thick, namely 15–50 μm in general, to function as a support on which a photosensitive resin layer is coated, and consequently a high resolution is difficult to obtain.

On the other hand, the problem of resolution may be solved, if a liquid form photoresist is used. However, it was difficult to obtain a highly sensitive resist by the conventional technology. In case light exposure is conducted by laser direct image formation process (LDI process), the sensitivity decreases markedly by receiving curing inhibition by oxygen in air, because it is conducted in the ambient atmosphere. In order to solve the problem, countermeasures such as coating said resist by a cover coat comprising mainly of water soluble or alkaline water soluble polymer having high oxygen barrier property such as polyvinyl alcohol etc. have been taken. However, it is the actual circumstances that there is no photosensitive resin composition having sufficient sensitivity.

From the capacity of the current laser direct image forming apparatus, the amount of light exposure to form a resist film, which can stand against etching, is necessary to be less than 5 $mJ/cm^2$, in order to be used industrially.

The present inventors made an intensive study about a resist for pattern formation without problems as mentioned above. As a result, they have found highly photosensitive compositions which can form a highly sensitive resist, on which a direct image formation with laser is possible, surprisingly even without coating an oxygen barrier cover coat and completed the present invention.

SUMMARY OF THE INVENTION

According to the present invention, there is provided a photosensitive resin composition for photoresist characterized by comprising:

(A) an unsaturated resin having carboxyl group(s) which is obtained by firstly reacting 0.8–1.3 moles of an ethylenic unsaturated monocarboxylic acid with 1 mole of an epoxy group of a homopolymer or copolymer (i) of ethylenic unsaturated monomer having an epoxy group to obtain an unsaturated resin (ii) which is then reacted with a dibasic acid anhydride, (B) ethylenic unsaturated compound without epoxy group, and (C) photopolymerization initiator.

The present invention is hereinafter described in more detail.

DETAILED DESCRIPTION OF THE INVENTION (A) Unsaturated resin having carboxyl group(s)

As ethylenic unsaturated monomer having an epoxy group used for the preparation of the above-mentioned polymer (i) which is a precurser of an unsaturated resin having carboxyl group(s) (A) there can be mentioned aliphatic epoxy unsaturated monomers such as glycidyl (meth) acrylate, methylglycidyl (meth)acrylate etc.; alicyclic epoxy unsaturated monomers represented by the following general formulae (I), (II) or (III).

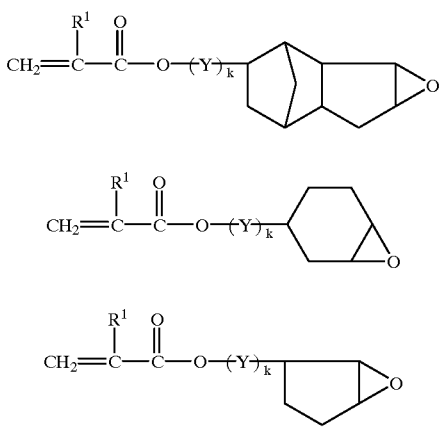

In the above-mentioned general formulae (I), (II) or (III), $R^1$ represents a hydrogen atom or methyl group, Y represents a divalent group represented by

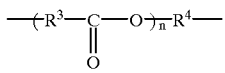

$R^3$ represents a divalent aliphatic saturated hydrocarbon group with 1–10 carbon atoms, $R^4$ represents a divalent aliphatic saturated hydrocarbon group with 1–6 carbon atoms, and n is an integral number of 0–10.

Among these compounds, monomers of the general formula (II), which can be easily produced industrially, are preferable.

In the above-mentioned, there can be mentioned as "a divalent aliphatic saturated hydrocarbon group with 1–10 carbon atoms", for example, methylene, ethylene, propylene, tetramethylene, ethylethylene, pentamethylene, hexamethylene, polymethylene and the like and as "divalent aliphatic saturated hydrocarbon group with 1–6 carbon atoms", for example, methylene, ethylene, propylene, tetramethylene, ethylethylene, pentamethylene, hexamethylene and the like.

The above-mentioned ethylenic unsaturated monomer having an epoxy group may be polymerized as such alone to form a homopolymer, or may be copymerized with other copolymerizable ethylenic unsaturated monomers so that the formed copolymer would contain at least 0.03 moles of epoxy groups per 100 parts by weight of the polymer.

As other copolymerizable ethylenic unsaturated monomers there can be mentioned per se known ethylenic unsaturated monomers, for example, styrene; (meth)acrylic compounds such as methyl (meth)acrylate, ethyl (meth)acrylate, n-butyl (meth)acrylate, isobutyl (meth)acrylate, t-butyl (meth)acrylate, 2-ethylhexyl (meth)acrylate, lauryl (meth) acrylate, cyclohexyl (meth)acrylate, cyclohexenyl (meth) acrylate, 2-hydroyethyl (meth)acrylate, hydroxypropyl (meth)acrylate, tetrahydrofurfuryl (meth)acrylate, ε-caprolactone-modified tetrahydrofurfuryl (meth)acrylate, methoxyethyl (meth)acrylate, methoxybutyl (meth)acrylate, phenoxyethyl (meth)acrylate, phenoxypolyethylene glycol (meth)acrylate, dicyclopentenyl (meth)acrylate, dicyclopentenyloxyethyl (meth)acrylate, isobornyl (meth)acrylate, tricyclo[5.2.1.0]decanyl (meth)acrylate, benzyl (meth) acrylate, ε-caprolactone-modified hydroxyethyl (meth) acrylate, polyethylene glycol mono(meth)acrylate, polypropylene glycol mono(meth)acrylate, 2-hydroxy-3-phenoxypropyl (meth)acrylate, 2-hydroxy-3-butoxypropyl (meth)acrylate, phthalic acid monohydroxyethyl (meth) acrylate, ARONIX M110 (made by Toagosei Co. Ltd.), (meth)acrylamide, N-methylol (meth)acrylamide, N-methylol (meth)acrylamide butyl ether, acryloylmorpholine, dimethylaminoethyl (meth)acrylate; N-vinyl-2-pyrrolidone and the like. These ethylenic unsaturated monomers may be used alone or optionally in combination of more than two.

Homopolymerization of an ethylenic unsaturated monomer having an epoxy group or copolymerization thereof with the above-mentioned other ethylenic unsaturated monomer(s) may be conducted by per se known radical polymerization process etc. to heat and polymerize in the presence of a radical polymerization initiator such as of organic peroxide type or azo type and in the presence of a diluent or without a diluent.

As diluents used here there can be mentioned compounds without active hydrogen group, for example, hydrocarbons such as toluene, xylene etc.; esters such as ethyl acetate, butyl acetate, isobutyl acetate, ethylene glycol methyl ether acetate, ethylene glycol ethyl ether acetate, propylene glycol monomethyl ether acetate, propylene glycol diacetate etc.; ketones such as methyl ethyl ketone, methyl isobutyl ketone, cyclohexanone etc.; ethers such as ethylene glycol dimethyl ether etc. These may be used alone or in mixing more than two.

The polymer thus obtained (i) may have a number-average molecular weight in a range of generally about 2,000 to about 100,000, preferably 3,000 to 80,000 and an epoxy equivalent in a range of generally about 100 to about 4,000, preferably 150 to 1,500

According to the present invention, the abovementioned polymer (i) may react with 0.8 to 1.3 moles, particularly 0.9 to 1.2 moles of ethylenic unsaturated monocarboxylic acid per 1 mole of epoxy group of said polymer to form an unsaturated resin (ii).

As such ethylenic unsaturated monocarboxylic acid there can be mentioned, for example, acrylic acid, methacrylic acid, 2-carboxyethyl (meth)acrylate, 5-carboxypentyl (meth)acrylate etc.

Moreover, as ethylenic unsaturated monocarboxylic acid there may be used half esters of a saturated and unsaturated dibasic acid anhydride and a (meth)acrylate having hydroxyl group(s), for example, half esters obtained by reaction in about equimolar ratio of saturated and unsaturated dibasic acid anhydride such as succinic anhydride, maleic anhydride, phthalic anhydride, tetrahydrophthalic anhydride, hexahydrophthalic anhydride, methylhexahydrophthalic anhydride, itaconic anhydride etc. and (meth) acrylates having hydroxyl group(s) such as hydroxyethyl (meth)acrylate, hydroxypropyl (meth)acrylate, hydroxybutyl (meth)acrylate, glycerol di(meth)acrylate, pentaerythritol tri(meth)acrylate etc. can be mentioned. These ethylenic unsaturated monocarboxylic acids may be used alone or mixing more than two.

Preparation of unsaturated resin (ii) may be conducted, for example, by reacting polymer (i) with the above-mentioned ethylenic unsaturated monocarboxylic acid at a temperature of about 80 to about 120° C. in the presence of a polymerization inhibitor such as hydroquinone or oxygen and a reaction catalyst such as tertiary amine, tertiary phosphine, quarternary ammonium salt such as tetraethylammonium chloride etc.

Thus, an epoxy group of polymer (i) reacts by ring-opening addition with a carboxyl group of an ethylenic unsaturated monocarboxylic acid to form a secondary hydroxyl group together with an ester bond.

Unsaturated resin having carboxyl group(s) (A) in the present invention are obtained by half-esterification of a hydroxyl group contained in the above-mentioned unsaturated resin (ii) by a dibasic acid anhydride. Namely, it is obtained by reacting the unsaturated resin (ii) with a saturated or unsaturated dibasic acid anhydride, for example, succinic anhydride, maleic anhydride, phthalic anhydride, tetrahydrophthalic anhydride, hexahydrophthalic anhydride, methylhexahydrophthalic anhydride, itaconic anhydride etc. at a temperature of about 30 to about 120° C. in the presence of a polymerization inhibitor such as hydroquinone or oxygen and a reaction catalyst such as tertiary amine, tertiary phosphine, quarternary ammonium salt such as tetraethylammonium chloride etc.

The content of unsaturated groups in the unsaturated resin having carboxyl group(s) (A) thus obtained is suitable, as unsaturation equivalent, in a range of generally 150 to 4,000, preferably 250 to 2,000, and more preferably 300 to 1,000. Said unsaturated resin (A) may have a number-average molecular weight in a range of generally about 3,000 to about 100,000, preferably about 5,000 to about 50,000 and more preferably about 8,000 to about 30,000. Moreover, the content of carboxyl groups in said unsaturated resin (A) is a necessary amount for the unexposed portions to be dissolved or swollen by a developer and eliminated and is generally 0.2 to 5 moles/kg resin, preferably 0.5 to 3 moles/kg resin.

(B) Ethylenic unsaturated compounds

As ethylenic unsaturated compounds (B) contained in the photosensitive resin compositions for photoresist of the present invention, there can be mentioned various mono- or polyfunctional polymerizable monomers having crosslink curing, photosensitive functional group(s) but no epoxy group.

As monofunctional polymerizable monomer, there can be used by optionally selecting from the monomers shown as examples of the above-mentioned other copolymerizable ethylenic unsaturated monomer in relation to the preparation of polymer (i), for example, aromatic vinyl compounds such as styrene, α-methylstyrene, vinyltoluene etc.; (meth)acrylic compounds such as methyl (meth)acrylate, ethyl (meth) acrylate, n-butyl (meth)acrylate, isobutyl (meth)acrylate, t-butyl (meth)acrylate, 2-ethylhexyl (meth)acrylate, lauryl (meth)acrylate, cyclohexyl (meth)acrylate, cyclohexenyl (meth)acrylate, 2-hydroyethyl (meth)acrylate, hydroxypropyl (meth)acrylate, tetrahydrofurfuryl (meth)acrylate, ε-caprolactone-modified tetrahydrofurfuryl (meth)acrylate, methoxyethyl (meth)acrylate, methoxybutyl (meth)acrylate, phenoxyethyl (meth)acrylate, phenoxypolyethylene glycol (meth)acrylate, dicyclopentenyl (meth)acrylate, dicyclopentenyloxyethyl (meth)acrylate, isobornyl (meth)acrylate, tricyclo[5.2.1.0]decanyl (meth)acrylate, benzyl (meth) acrylate, ε-caprolactone-modified hydroxyethyl (meth) acrylate, polyethylene glycol mono(meth)acrylate, polypropylene glycol mono(meth)acrylate, 2-hydroxy-3-phenoxypropyl (meth)acrylate, 2-hydroxy-3-butoxypropyl (meth)acrylate, phthalic acid monohydroxyethyl (meth) acrylate, ARONIX M110 (made by Toagosei Co. Ltd.), (meth)acrylamide, N-methylol (meth)acrylamide, N-methylol (meth)acrylamide butyl ether, acryloylmorpholine, dimethylaminoethyl (meth)acrylate; N-vinyl-2-pyrrolidone, and the like.

As difunctional polymerizable monomer, there can be mentioned, for example, ethylene glycol di(meth)acrylate, diethylene glycol di(meth)acrylate, polyethylene glycol di(meth)acrylate, propylene glycol di(meth)acrylate, dipropylene glycol di(meth)acrylate, polypropylene glycol di(meth)acrylate, neopentyl glycol di(meth)acrylate, 1,4-butanediol di(meth)acrylate, 1,6-hexanediol di(meth) acrylate, bisphenol A ethylene oxide modified di(meth) acrylate, bisphenol A propylene oxide modified di(meth) acrylate, 2-hydroxy-1-acryloxy-3-meth-acryloxypropane, tricyclodecane dimethanol di(meth)acrylate, di(meth) acryloyloxyethyl acid phosphate; KAYARAD HX-220, 620, R-604, MANDA (made by Nippon Kayaku Co., Ltd.) and the like.

As tri or more functional polymerizable monomer, there can be mentioned, for example, trimethylolpropane tri (meth)acrylate, trimethylolpropane polyethylene oxide modified tri(meth)acrylate, trimethylolpropane polypropylene oxide modified tri(meth)acrylate, glycerol tri(meth) acrylate, glycerol ethylene oxide modified tri(meth)acrylate, glycerol propylene oxide modified tri(meth)acrylate, pentaerythritol tri(meth)acrylate, pentaerythritol tetra(meth) acrylate, isocyanuric acid ethylene oxide modified triacrylate, dipentaerythritol hexa(meth)acrylate and the like.

Among the above-mentioned ethylenic unsaturated compounds, there can be mentioned, as especially preferable ones, trimethylolpropane triacrylate (TMPTA), trimethylolpropane polyethylene oxide modified tri(meth)acrylate, trimethylolpropane polypropylene oxide modified tri(meth) acrylate, polyethylene glycol di(meth)acrylate, polypropylene glycol di(meth)acrylate, bisphenol A ethylene oxide modified di(meth)acrylate and bisphenol A propylene oxide modified di(meth)acrylate.

The mixing ratio of unsaturated resin having carboxyl group(s) (A) and these ethylenic unsaturated compounds (B) may be varied in a wide range according to the properties required for the final compositions, but may be in a range of generally 1 to 100 parts by weight, preferably 1 to 60 parts by weight and more preferably 2 to 40 parts by weight of a compound (B) per 100 parts by weight of a resin (A).

(C) Photopolymerization initiator:

In the photosensitive resin compositions for photoresist of the present invention a photopolymerization initiator (C) may be included in order to conduct crosslink curing by irradiation of light. As a photopolymerization initiator (C) used in that case, there can be mentioned a photopolymerization initiator alone, a photopolymerization initiator system by combining a photopolymerization initiator and a sensitizing dye, etc.

Namely, there can be used as photopolymerization initiator substances which decompose by light excitation by itself alone or by mutual action with a sensitizer, more specifically compounds which generate active radicals for crosslinking reaction or polymerization reaction of the above-mentioned photosensitive functional groups by their own cleavage reaction or hydrogen abstraction reaction from another molecule. In case of pattern formation by direct image formation, it is desirable to increase the sensitivity of the resist photosensitive layer in order to conduct a fine etching processing with a high productivity and therefore the selection of a highly sensitive photopolymerization initiator system is extremely important. As specific examples of photopolymerization initiator (C) which may be used in the present invention, for example, the following compounds can be mentioned:

benzoin, benzoin ethers such as benzoin methyl ether, benzoin ethyl ether, benzoin isopropyl ether, benzoin isobutyl ether etc.;

acetophenones such as acetophenone, diethoxyacetophenone, propiophenone, benzyl dimethyl ketal, 2-hydroxy-2-methyl-1-phenylpropane-1-one, α-hydroxyisobutylphenone, α,α'-dichloro-4-phenoxyacetophenone, 1-hydroxycyclohexyl-phenyl ketone, 1-phenyl-1,2-propanedione-2-(0-ethoxycarbonyl) oxime, 2-methyl-2-morpholino-(4-thiomethylphenyl) propan-1-one, 2-benzyl-2-dimethylamino-1-(4-morpholinophenyl)-butanone etc.;

aromatic carbonyl compounds such as 2,4,6-trimethylbenzoylphenylphosphine oxide, benzophenone, methyl 0-benzoylbenzoate, hydroxybenzophenone, 2-isopropylthioxanthone, 2,4-dimethylthioxanthone, 2,4-diethylthioxanthone, 2,4-dichlorothioxanthone, benzyl, xanthone, thioxanthone, anthraquinone etc.;

organic peroxides such as benzoyl peroxide, tert-butyl peroxybenzoate, tert-butyl peroxy-2-ethylhexanoate, tert-butyl hydroperoxide, di-tert-butyl diperoxyisophthalate, 3,3',4,4'-tetra(tert-butylperoxicarbonyl)benzophenone etc.;

diphenylhalonium salts such as diphenyliodonium bromide, diphenyliodonium chloride etc.;

halides such as carbon tetrachloride, carbon tetrabromide, chloroform, iodoform etc.;

heterocyclic and polycyclic compounds such as 3-phenyl-5-isoxazolone, 2,4,6-tris(trichloromethyl)-s-triazine, 2-methyl-4,6-bis(trichloromethyl)-s-triazine, 2-(4-methoxyphenyl)-4,6-bis(trichloromethyl)-s-triazine, benzanthrone etc.;

azo compounds such as 2,2'-azobis(2,4-di-methylvaleronitrile), 2,2'-azobisisobutylonitrile, 1,1'-azobis(cyclohexane-1-carbonitrile), 2,2'-azobis(2-methylbutylonitrile) etc.;

iron-arene complex (cf. European Patent Publication No. 152377);

titanocene compounds (cf. Japanese Laid-Open Patent Publication No. 221110/1988) etc.

These photopolymerization initiators may be used alone or in mixing its plurality. The amount of these photopolymerization initiators is not limited but may be varied in a wide range according to their kinds etc. and may be in a range of generally 0.1 to 25 parts by weight, preferably 0.15 to 20 parts by weight and more preferably 0.2 to 15 parts by weight per 100 parts by weight of the mixture of unsaturated resin having carboxyl group(s) (A) and ethylenic unsaturated compound (B) (hereinafter referred to as photocurable resin component).

Moreover, a photopolymerization promoter may be used together with a photopolymerization initiator in order to promote the photopolymerization reaction by these photopolymerization initiators. As photopolymerization promoter which may be used together there can be mentioned, for example, tertiary amines such as triethylamine, triethanolamine, methyldiethanolamine, methyl 4-dimethylaminobenzoate, ethyl 4-dimethylaminobenzoate, isoamyl 4-dimethylaminobenzoate, (2-dimethylamino)ethyl benzoate, Michler's ketone, 4,4'-diethylaminobenzophenone; alkylphosphines such as triphenylphosphine; thioethers such as β-thioglycol. These photopolymerization promoters may be used alone or in mixing more than two and the blending amount is preferable in a range of 0.1 to 15 parts by weight and particularly 0.2 to 10 parts by weight per 100 parts by weight of the photocurable resin component.

In case a visible light is used as active light source in the photosensitive resin compositions for photoresist of the present invention, especially di-tert-butyl diperoxyisophthalate, 3,3',4,4'-tetra(tert-butylperoxicarbonyl)benzophenone, iron-arene complex and titanocene compounds are preferable among the above-mentioned photopolymerization promoters, due to their high activity for crosslinking or polymerization.

Sensitizing dyes

In the photosensitive resin compositions for photoresist of the present invention the photosensivity can be largely improved by using a sensitizing dye together in combination with a photopolymerization initiator. Especially in case a visible light is used as active light source, it is preferable to use also a sensitizing dye which is excited by a light of 400 to 700 nm and has a mutual action with the above-mentioned photocurable resin component and photopolymerization initiator. The "mutual action" mentioned here includes energy transfer and electron transfer from the excited sensitizing dye to photocurable resin or photopolymerization initiator.

As specific examples of sensitizing dyes there can be mentioned dyes of thioxanthene type, xanthene type, ketone type, thiopyrilium salt type, base styryl type, merocyanine type, 3-substituted coumalin type, cyanine type, acridine type, thiazine type etc. More specifically dyes described in Japanese Laid-Open Patent Publication No. 179064/1991 (=U.S. Patent Publication No. 5,102,775) can be mentioned as examples.

Moreover, sensitizing dyes represented by the following general formulae (IV) or (V) may be preferably used.

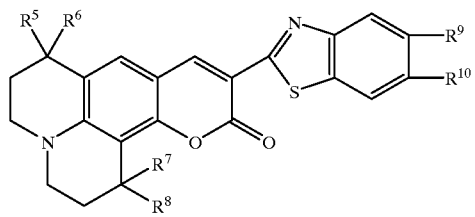

(IV)

wherein $R^5$, $R^6$, R and $R^8$ each independently represents alkyl group of 1 to 3 carbon atoms, preferably methyl group, and $R^9$ and $R^{10}$ each independently represents hydrogen atom, alkyl group of 1 to 4 carbon atoms, alkoxy group of 1 to 4 carbon atoms, alkoxycarbonyl group of 2 to 5 carbon atoms, Cl, Br, CN, $NO_2$ or $SO_2CH_3$, and preferably hydrogen or methyl group.

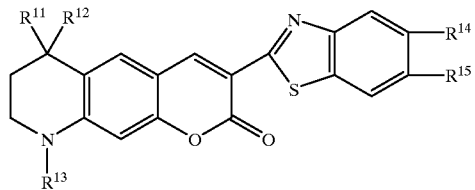

(V)

wherein $R^{11}$, $R^{12}$ and $R^{13}$ each independently represents alkyl group of 1 to 3 carbon atoms, preferably methyl group, and $R^{14}$ and $R^{15}$ each independently represents hydrogen atom, alkyl group of 1 to 4 carbon atoms, alkoxy group of 1 to 4 carbon atoms, alkoxycarbonyl group of 2 to 5 carbon atoms, Cl, Br, CN, $NO_2$ or $SO_2CH_3$, and preferably hydrogen or methyl group.

The amount of these sensitizing dyes varies according to their kinds and the kinds of photocurable resin component and/or photopolymerization initiator to act mutually with and is difficult to be exactly prescribed, but is generally in a range of 0.1 to 10 parts by weight, preferably 0.2 to 8 parts by weight and more preferably 0.3 to 5 parts by weight per 100 parts by weight of photocurable resin component.

Other additives:

In the photosensitive resin compositions for photoresist of the present invention compounds containing nitrogen may be blended as necessary. There can be mentioned as examples compounds described in Japanese Laid-Open Patent Publication No. 179064/1991 (=U.S. Patent Publication No. 5,102,775), for example, benzotriazoles such as benzotriazole, methylbenzotriazole, N-hydroxybenzotriazole, chlorobenzotriazole, dichlorobenzotriazole, trichlorobenzotriazole etc.; pyrazoles such as 3-methylpyrazole, 3,5-dimethylpyrazole etc. Among these, especially benzotriazoles are preferable.

The above-mentioned compounds containing nitrogen may be used alone or in combination of more than two in the photosensitive resin compositions for photoresist of the present invention. The amount of its usage may be in a range of generally 0.01 to 20 parts by weight, preferably 0.05 to 15 parts by weight and more preferably 0.1 to 10 parts by weight per 100 parts by weight of photocurable resin component.

In case of blending the above-mentioned compounds containing nitrogen in the photosensitive resin compositions, the resolution of image is amplified at the same time.

Moreover, in the photosensitive resin compositions for photoresist of the present invention there can be included non-reactive additives such as dyes, pigments, adhesion improving agents, polymerization inhibitors, coating surface modifiers, plasticizers etc.; or solvents such as organic solvents etc. to facilitate the coating.

Photosensitive resin compositions for photoresist

The photosensitive resin compositions for photoresist of the present invention can be prepared dissolving the above-mentioned unsaturated resin having carboxyl group(s) (A), ethylenic unsaturated compound (B), photopolymerization initiator (C) and the abovementioned other components in a solvent, mixing homogeneously by stirring in a dark room at room temperature for about 30 minutes, and optionally diluting with solvent to obtain appropriate viscosity and non-volatile content according to the coating condition.

Etching resist, which is formed from the photosensitive compositions of the present invention, can form an image pattern by forming a resist film by developing with weak alkali after exposure by an active light, washing with water and drying, then by etching the metal with acid or alkali. Moreover, as necessary, a step of after exposure with a visible light and/or ultraviolet light for a short time may be added after developing, water washing and drying. By this after exposure step, the precision of an etching processed circuit pattern with electroconductive film of metal and ITO etc. can be markedly improved.

As the photosensitive resin compositions of the present invention has a high resolution and an excellent property of forming a fine image pattern by direct image formation process, they may be effectively used as photoresist in the field of printed circuit board, substrate for display, metal fine processing etc.

EXAMPLES

The present invention is hereinafter described more specifically by way of Examples. In the Examples, "part(s)" and "%" are by weight, unless specified otherwise.

Resin Preparation Example 1

A liquid mixture consisting of 80 parts of glycidyl methacrylate, 20 parts of styrene and 2 parts of t-butylperoxy-2-ethylhexanoate (Perbutyl 0; made by NOF Corporation) was added over 3 hours drop by drop into 62.5 parts of isobutyl acetate kept at 115° C. in a nitrogen atmosphere. After keeping at 115° C. for 30 minutes after the addition, a liquid mixture consisting of 0.5 parts of t-butylperoxy-2-ethylhexanoate and 5 parts of isobutyl acetate was added drop by drop over 30 minutes and kept for further 5 hours to obtain a solution of polymer composition having glycidyl groups.

Then 40 parts of isobutyl acetate, 0.1 part of hydroquinone monomethyl ether and 1 part of tetraethylammonium bromide were added to this solution, to which 40 parts of acrylic acid was added drop by drop in 1 hour at 110° C. while blowing air in, and reacted for further 8 hours in keeping that temperature to obtain a solution of unsaturated resin. Furthermore, 62 parts of isobutyl acetate was added to the solution while blowing air in and, keeping the temperature at 75° C., 28 parts of tetrahydroxyphthalic anhydride was added and kept for 2 hours to obtain "resin a". (Resin acid value: 1.1 moles COOH/kg resin, ethylenic unsaturation equivalent: 306, resin Tg: 20° C., solid content: 50%).

Resin Preparation Example 2

"Resin b" was obtained by operating in the same manner as Resin Preparation Example 1 except using hexahydroxyphthalic anhydride instead of tetrahydroxyphthalic anhydride. (Resin acid value: 1.1 moles COOH/kg resin, ethylenic unsaturation equivalent: 306, resin Tg: 20° C., solid content: 50%).

Resin Preparation Example 3

A liquid mixture consisting of 80 parts of glycidyl methacrylate, 20 parts of styrene and 2 parts of t-butylperoxy-2-ethylhexanoate was added over 3 hours drop by drop into 62.5 parts of isobutyl acetate kept at 115° C. in a nitrogen atmosphere. After keeping at 115° C. for 30 minutes after the addition, a liquid mixture consisting of 0.5 parts of t-butylperoxy-2-ethylhexanoate and 5 parts of isobutyl acetate was added drop by drop over 30 minutes and kept for further 5 hours to obtain a solution of polymer composition having glycidyl groups.

Then 40 parts of isobutyl acetate, 0.1 part of hydroquinone monomethyl ether and 1 part of tetraethylammonium bromide were added to this solution, to which 48 parts of methacrylic acid was added drop by drop in 1 hour at 110° C. while blowing air in, and reacted for further 8 hours in keeping that temperature to obtain a solution of unsaturated resin. Furthermore, 66 parts of isobutyl acetate was added to the solution while blowing air in and, keeping the temperature at 75° C., 29.5 parts of tetrahydroxyphthalic anhydride was added and kept for 2 hours to obtain "resin c". (Resin acid value: 1.1 moles COOH/kg resin, ethylenic unsaturation equivalent: 322, resin Tg: 20° C., solid content: 50%).

Resin Preparation Example 4

A liquid mixture consisting of 100 parts of glycidyl methacrylate and 2.5 parts of t-butylperoxy-2-ethylhexanoate was added over 3 hours drop by drop into 63 parts of isobutyl acetate kept at 115° C. in a nitrogen atmosphere. After keeping at 115° C. for 30 minutes after the addition, a liquid mixture consisting of 0.5 parts of t-butylperoxy-2-ethylhexanoate and 5 parts of isobutyl acetate was added drop by drop over 30 minutes and kept for further 5 hours to obtain a solution of polymer composition having glycidyl groups.

Then 47 parts of isobutyl acetate, 0.1 part of hydroquinone monomethyl ether and 1 part of tetraethylammonium bromide were added to this solution, to which 50 parts of acrylic acid was added drop by drop in 1 hour at 110° C. while blowing air in, and reacted for further 8 hours in keeping that temperature to obtain a solution of unsaturated resin. Furthermore, 67 parts of isobutyl acetate was added to the solution while blowing air in and, keeping the temperature at 75° C., 30 parts of tetrahydroxyphthalic anhydride was added and kept for 2 hours to obtain "resin d". (Resin acid value: 1.1 moles COOH/kg resin, ethylenic unsaturation equivalent: 263, resin Tg: 0° C., solid content: 50%).

Resin Preparation Example 5

A liquid mixture consisting of 80 parts of 3,4-epoxy-cyclohexylmethyl methacrylate, 20 parts of styrene and 2 parts of t-butylperoxy-2-ethylhexanoate was added over 3 hours drop by drop into 62.5 parts of isobutyl acetate kept at 115° C. in a nitrogen atmosphere. After keeping at 115° C. for 30 minutes after the addition, a liquid mixture consisting of 0.5 parts of t-butylperoxy-2-ethylhexanoate and 5 parts of isobutyl acetate was added drop by drop over 30 minutes and kept for further 5 hours to obtain a solution of polymer composition having glycidyl groups.

Then 32 parts of isobutyl acetate, 0.1 part of hydroquinone monomethyl ether and 1 part of tetraethylammonium bromide were added to this solution, to which 29 parts of acrylic acid was added drop by drop over 1 hour at 110° C. while blowing air in, and reacted for another 8 hours in keeping that temperature to obtain a solution of unsaturated resin. Furthermore, 58 parts of isobutyl acetate was added to the solution while blowing air in and, keeping the temperature at 75° C., 27 parts of tetrahydroxyphthalic anhydride was added and kept for 2 hours to obtain "resin e". (Resin acid value: 1.1 moles COOH/kg resin, ethylenic unsaturation equivalent: 392, resin Tg: 25° C., solid content: 50%).

Resin Preparation Example 6

A liquid mixture consisting of 70 parts of glycidyl methacrylate, 30 parts of isobornyl methacrylate and 2 parts of t-butylperoxy-2-ethylhexanoate was added in 3 hours drop by drop into 68 parts of isobutyl acetate kept at 115° C. in a nitrogen atmosphere. After keeping at 115° C. for 30 minutes after the addition, a liquid mixture consisting of 0.5 parts of t-butylperoxy-2-ethylhexanoate and 5 parts of isobutyl acetate was added drop by drop over 30 minutes and kept for another 5 hours to obtain a solution of polymer composition having glycidyl groups.

Then 27 parts of isobutyl acetate, 0.1 part of hydroquinone monomethyl ether and 1 part of tetraethylammonium bromide were added to this solution, to which 35.5 parts of acrylic acid was added drop by drop in 1 hour at 110° C. while blowing air in, and reacted for further 8 hours in keeping that temperature to obtain a solution of unsaturated resin. Furthermore, 62 parts of isobutyl acetate was added to the solution while blowing air in and, keeping the temperature at 75° C., 38.5 parts of tetrahydroxyphthalic anhydride was added and kept for 2 hours to obtain "resin f". (Resin acid value: 1.1 moles COOH/kg resin, ethylenic unsaturation equivalent: 357, resin Tg: 40° C., solid content: 50%).

Resin Preparation Example 7

A liquid mixture consisting of 70 parts of glycidyl methacrylate, 20 parts of styrene and 2 parts of t-butylperoxy-2-ethylhexanoate was added over 3 hours drop by drop into 62.5 parts of isobutyl acetate kept at 115° C. in a nitrogen atmosphere. After keeping at 115° C. for 30 minutes after the addition, a liquid mixture consisting of 0.5 parts of t-butylperoxy-2-ethylhexanoate and 5 parts of isobutyl acetate was added drop by drop over 30 minutes and kept for another 5 hours to obtain a solution of polymer composition having glycidyl groups.

Then 31 parts of isobutyl acetate, 0.1 part of hydroquinone monomethyl ether and 1 part of tetraethylammonium bromide were added to this solution, to which 28 parts of acrylic acid (0.69 equivalents to epoxy group) was added drop by drop in 1 hour at 110° C. while blowing air in, and reacted for further 8 hours in keeping that temperature to obtain a solution of unsaturated resin. Furthermore, 56.5 parts of isobutyl acetate was added to the solution while blowing air in and, keeping the temperature at 75° C., 25.5 parts of tetrahydroxyphthalic anhydride was added and kept for 2 hours to obtain "resin g". (Resin acid value: 1.1 moles COOH/kg resin, ethylenic unsaturation equivalent: 400, resin Tg: 25° C., solid content: 50%).

Resin Preparation Example 8

A liquid mixture consisting of 4 parts of glycidyl methacrylate, 20 parts of styrene, 56 parts of n-butyl methacrylate, 20 parts of 2-hydroxyethyl methacrylate and 2 parts of t-butylperoxy-2-ethylhexanoate was added over 3 hours drop by drop into 62.5 parts of isobutyl acetate kept at 115° C. in a nitrogen atmosphere. After keeping at 115° C. for 30 minutes after the addition, a liquid mixture consisting of 0.5 parts of t-butylperoxy-2-ethylhexanoate and 5 parts of isobutyl acetate was added drop by drop over 30 minutes and kept for further 5 hours to obtain a solution of polymer composition having glycidyl groups.

Then 12.3 parts of isobutyl acetate, 0.1 part of hydroquinone monomethyl ether and 1 part of tetraethylammonium bromide were added to this solution, to which 2 parts of acrylic acid was added drop by drop over 10 minutes while blowing air in, and reacted for further 6 hours in keeping that temperature to obtain a solution of unsaturated resin. Furthermore, 44 parts of isobutyl acetate was added to the solution while blowing air in and, keeping the temperature at 75° C., 20.5 parts of tetrahydroxyphthalic anhydride was added and kept for 2 hours to obtain "resin h". (Resin acid value: 1.1 moles COOH/kg resin, ethylenic unsaturation equivalent: 4482, resin Tg: 300C, solid content: 50%).

Examples 1–5 and Comparative Examples 1–2

To the resin obtained according to Resin Preparation Examples 1–5, and 7–8, a solution of 3 parts of visible light polymerization initiator (*1) and 1 part of sensitizing dye (*2) in 5 parts of benzyl alcohol, and 5 parts of trimethylolpropane triacrylate (TMPTA), were added and diluted with methyl ethyl ketone to make solid content to 40% and to obtain liquid resist shown in Table 1 later.

After a copper laminated plate with copper thickness of 35 $\mu$m was coated with the liquid resist by a bar coater to make a film with 15 $\mu$m thickness in terms of dry film thickness, it was dried at 80° C. for 10 minutes. Then 5% aqueous solution of polyvinyl alcohol was coated on the resist film to make a film with 2 $\mu$m thickness in terms of dry film thickness and dried in air. Then, after scanning exposure at 5 mL/cm$^2$ with argon ion laser, it was developed by dipping in 0.5% aqueous solution of sodium carbonate at 25° C. and washed with water. After drying, the copper exposed by developing was etched in 30% aqueous solution of cuprous chloride at 50° C.

Results of performance tests of the obtained resists are shown in Table 1.

(*1) Titanocene compound represented by the following formula was used as photopolymerization initiator.

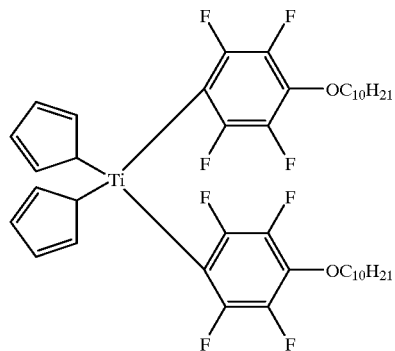

(*2) NKX-1595 made by Nippon Kanko Shikiso Kenkyusho and represented by the following formula was used as sensitizing dye.

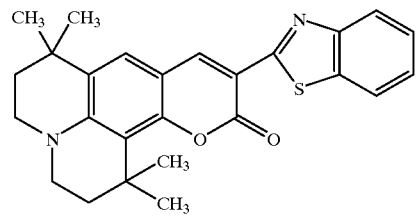

Example 6

Liquid photoresist was prepared and used in experiment without conducting the formation of oxygen barrier film by polyvinyl alcohol and in the same manner as Examples 1–5 except using 15 parts of TMPTA.

Results of performance tests of the obtained resist are shown in Table 1.

Example 7

Liquid photoresist was prepared and used in experiment in the same manner as Example 6 except using 20 parts of polyethylene glycol (molecular weight 200) diacrylate instead of 15 parts of TMPTA.

Results of performance tests of the obtained resist are shown in Table 1.

TABLE 1

|  |  | Examples | | | | | | | Comparative Examples | |
|---|---|---|---|---|---|---|---|---|---|---|
|  |  | 1 | 2 | 3 | 4 | 5 | 6 | 7 | 1 | 2 |
| (A) | Unsaturated resin having carboxyl group(s) | a | b | c | d | e | f | f | g | h |
|  | Glycidyl methacrylate | 80 | 80 | 80 | 100 |  | 70 | 70 | 80 | 4 |
|  | 3,4-epoxycyclohexylmethyl methacrylate |  |  |  |  | 80 |  |  |  |  |
|  | styrene | 20 | 20 | 20 |  | 20 |  |  | 20 | 20 |
|  | Isobornyl methacrylate |  |  |  |  |  | 30 | 30 |  |  |
|  | n-Butyl methacrylate |  |  |  |  |  |  |  |  | 56 |
|  | 2-Hydroxyethyl methacrylate |  |  |  |  |  |  |  |  | 20 |
|  | Perbutyl 0 | 2 | 2 | 2 | 2.5 | 2 | 2 | 2 | 2 | 2 |
|  | Acrylic acid | 40 | 40 |  | 50 | 29 | 35.5 | 35.5 | 28 | 2 |
|  | Methacrylic acid |  |  | 48 |  |  |  |  |  |  |
|  | Tetrahydroxyphthalic anhydride | 28 |  | 29.5 | 30 | 27 | 38.5 | 38.5 | 25.5 | 20.5 |
|  | Hexahydroxyphthalic anhydride |  | 28 |  |  |  |  |  |  |  |
|  | Total | 170.0 | 170.0 | 179.5 | 182.5 | 158.0 | 176.0 | 176.0 | 155.5 | 124.5 |
|  | Resin acid value mol/(kg resin solid content) | 1.1 | 1.1 | 1.1 | 1.1 | 1.1 | 1.1 | 1.1 | 1.1 | 1.1 |
|  | Resin Tg (° C.) | 20 | 20 | 20 | 0 | 25 | 40 | 40 | 25 | 30 |
|  | Unsaturation equivalent | 306 | 306 | 322 | 263 | 392 | 357 | 357 | 400 | 4482 |
|  | Number-average molecular weight (thousand) | 12 | 13 | 11 | 11 | 11 | 11 | 11 | 10 | 12 |
| (B) | Polymerizable monomer (TMPTA) | 5 | 5 | 5 | 5 | 5 | 15 |  | 5 | 5 |
|  | Polyethylene glycol (molecular weight 200) diacrylate |  |  |  |  |  |  | 20 |  |  |
| (C) | Photopolymerization initiator (titanocene compound) | 3 | 3 | 3 | 3 | 3 | 3 | 3 | 3 | 3 |
|  | Sensitizing dye (NKX-1595) | 1 | 1 | 1 | 1 | 1 | 1 | 1 | 1 | 1 |
|  | Benzotriazole | 5 | 5 | 5 | 5 | 5 | 5 | 5 | 5 | 5 |
|  | Oxygen barrier film | yes | yes | yes | yes | yes | none | none | yes | yes |
|  | Resist performance |  |  |  |  |  |  |  |  |  |
|  | Storability of resist liquid | ○ | ○ | ○ | ○ | ○ | ○ | ○ | Δ | ○ |
|  | Drying property of resist film | ○ | ○ | ○ | ○ | ○ | ○ | ○ | ○ | ○ |
|  | Exposure sensitivity | 8 | 8 | 8 | 9 | 7 | 5 | 6 | 8 | 1 |
|  | Developability | ○ | ○ | ○ | ○ | ○ | ○ | ○ | ○ | X |
|  | Resistance to etching solution | ○ | ○ | ○ | ○ | ○ | ○ | ○ | ○ | — |

Performance tests were conducted as follows,

Storability of resist:

180 ml of resist liquid of Examples 1–6 was placed in 250 ml can, stopped and stored for 3 months in a room at constant temperature at 30° C. After that the viscosity change of resist liquid was checked by B type viscosimeter.

Degree of viscosity increase compared to the initial viscosity is defined as viscosity increase ratio, and 1–1.2 is ○, 1.3–1.9 is Δ, and more than 2 is X. Viscosity increase ratio=viscosity after storage/initial viscosity.

Drying property of resist film:

After drying of the resist film (after air drying of cover coat in case of Examples 1–5), it was evaluated by touching with finger. Not sticky: ○, a little sticky: Δ, considerably sticky: X.

Developability:

After scanning exposure to make 50/50 μm line/space pattern, the state after development by dipping in 0.5% aqueous solution of sodium hydroxide at 25° C. was observed. In case the pattern formed by exposure remains and no residue is found in non-exposed portions, it is evaluated as ○; in case residue is partly found in non-exposed portions, Δ; and in case much residue is found in non-exposed portions, X.

Exposure sensitivity:

After scanning exposure through a 21-step step tablet film, it was developed and the number of remaining step tablet sensitivity steps was read.

Resistance to etching:

In case the pattern remains without break after etching by dipping in 30% aqueous solution of cuprous chloride at 50° C., it is evaluated as ○; in case the pattern is partly broken, Δ; and in case more than half of the pattern is broken, X.

What is claimed is:

1. A photosensitive resin composition for photoresist consisting essentially of:
   (A) an unsaturated resin having carboxyl group(s) which is obtained by firstly reacting 0.8 to 1.3 moles of an ethylenic unsaturated monocarboxylic acid with 1 mole of an epoxy group of a homopolymer or copolymer (i) of ethylenic unsaturated monomer having an epoxy group to obtain an unsaturated resin (ii) which is then reacted with a dibasic acid anhydride, said unsaturated resin having an unsaturation equivalent of 150 to 4,000, a number-average molecular weight of about 3.000 to about 100,000 and carboxyl groups of 0.2 to 5 moles/kg resin,
   (B) a di- or more functional ethylenic unsaturated compound without epoxy group, selected from the group consisting of trimethylolpropane triacrylate, trimethylolpropane polyethylene oxide modified tri (methacrylate, trimethylolpropane polypropylene oxide modified tri(meth)acrylate polyethylene glycol di(meth acrylate, polypropylene glycol di(meth) acrylate, bisphenol A ethylene oxide modified di(meth acrylate and bisphenol A propylene oxide modified di(meth)acrylate,
   (C) a photopolymerization initiator,
   (D) a sensitizing dye, and
   (E) a nitrogen-containing compound selected from the group consisting of benzotriazoles and pyrazoles.

2. The composition set forth in claim 1, wherein the copolymer (i) has epoxy groups of more than 0.03 moles per 100 parts by weight.

3. The composition set forth in claim 1, which comprises 1 to 100 parts by weight of ethylenic unsaturated compound (B) per 100 parts by weight of the unsaturated resin (A).

4. The composition set forth in claim 1, wherein the photopolymerization initiator (C) is di-tert-butyldiperoxyisophthalate, 3,3',4,4'-tetra(tert-butylperoxycarbonyl)benzophenone, iron-arene complex or titanocene compound.

5. The composition set forth in claim 1, wherein the sensitizing dye (D) is selected from the group consisting of sensitizing dyes represented by the formulae

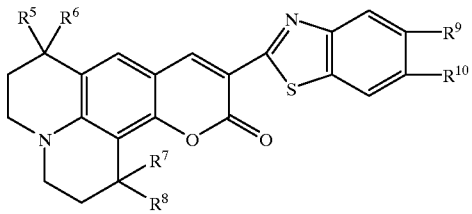

wherein $R^5$, $R^6$, $R^7$ and $R^8$ each independently represents alkyl group of 1 to 3 carbon atoms and $R^9$ and $R^{10}$ each independently represents hydrogen atom, alkyl group of 1 to 4 carbon atoms, alkoxy group of 1 to 4 carbon atoms, alkoxycarbonyl group of 2 to 5 carbon atoms, Cl, Br, CN, $NO_2$ or $SO_2CH_3$, and

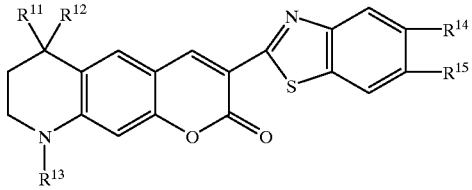

wherein $R^{11}$, $R^{12}$ and $R^{13}$ each independently represents alkyl group of 1 to 3 carbon atoms, and $R^{14}$ and $R^{15}$ each independently represents hydrogen atom, alkyl group of 1 to 4 carbon atoms, alkoxy group of 1 to 4 carbon atoms, alkoxycarbonyl group of 2 to 5 carbon atoms, Cl, Br, CN, $NO_2$ or $SO_2CH_3$.

6. The composition set forth in claim 1, which comprises 0.1 to 25 parts by weight of photopolymerization initiator (C) per 100 parts by weight of the total of the unsaturated resin having carboxyl group(s) (A) and ethylenic unsaturated compound (B).

7. The composition set forth in claim 1, which comprises 0.1 to 10 parts by weight of sensitizing dye (D) per 100 parts by weight of the total of the unsaturated resin having carboxyl group(s) (A) and ethylenic unsaturated compound (B).

8. The composition set forth in claim 1, which comprises 0.01 to 20 parts by weight of the nitrogen-containing compound (E) per 100 parts by weight of the total of the unsaturated resin having carboxyl group(s) (A) and ethylenic unsaturated compound (B).

9. An etching resist formed by using the composition set forth in claim 1.

* * * * *